United States Patent [19]
Abe et al.

[11] Patent Number: 4,845,456
[45] Date of Patent: Jul. 4, 1989

[54] MAGNETIC SENSOR

[75] Inventors: Hiraku Abe, Miyagi; Ichiro Tokunaga, Furukawa, both of Japan

[73] Assignee: Alps Electric Co., Ltd., Japan

[21] Appl. No.: 244,888

[22] Filed: Sep. 15, 1988

[30] Foreign Application Priority Data

Jan. 11, 1988 [JP] Japan .................................. 63-2456

[51] Int. Cl.[4] .......................................... H01L 43/00
[52] U.S. Cl. .................................. 338/32 R; 338/252
[58] Field of Search ........................ 338/32 R, 32 H; 324/252, 208, 207, 174, 210

[56] References Cited

U.S. PATENT DOCUMENTS

| | | | |
|---|---|---|---|
| 3,353,010 | 11/1967 | Kataoka et al. | 338/32 R |
| 3,928,836 | 12/1975 | Makino et al. | 338/32 R |
| 4,492,922 | 1/1985 | Ohkubu | 338/32 R X |
| 4,503,394 | 5/1985 | Kawakami et al. | 338/32 R X |
| 4,594,548 | 6/1986 | Takahashi et al. | 338/32 R X |

Primary Examiner—E. A. Goldberg
Assistant Examiner—M. M. Lateef
Attorney, Agent, or Firm—Guy W. Shoup; Paul J. Winters

[57] ABSTRACT

In a magnetic sensor, a first series-connected magnetic resistance element circuit is connected parallel to a second series-connected magnetic resistance element circuit, which finally forms a bridge circuit. The magnetic resistance elements are subdivided into two or three subdivided pieces. These subdivided pieces are arranged at a predetermined interval and connected with each other by conductors having low resistivity.

1 Claim, 5 Drawing Sheets

MAGNETIC SENSOR

BACKGROUND OF THE INVENTION

1. Field of the Invention

The present invention generally relates to a magnetic sensor. More specifically, the invention is directed to a magnetic sensor suitable for detecting a magnetic field produced by a moving magnetic medium.

2. Description of Prior Art

In a prior art magnetic sensor for detecting a magnetic field produced by the movement of the magnetic medium, as illustrated in FIG. 4, the magnetic sensor 12 is positioned opposite to a magnetic encoder type magnetic drum 11, an amplifier 13 is connected to an output terminal of this magnetic sensor 12, and a waveform shaping circuit 14 is connected to an output terminal of the amplifier 13. Based upon an output signal from this waveform shaping circuit 14, an amount of rotation as well as a direction of rotation of the magnetic drum 11 are detected.

In this case, the structure of the magnetic sensor 12 is illustrated in FIG. 5. When InSb is employed as magnetic resistance elements $R_1$ to $R_4$, a thin sliced piece is attached to a glass piece, whereby a thin film having a thickness of 5 to 10 $\mu$m is formed by way of a mechanical or chemical method, and a metal electrode is inserted therein by a photo-lithography means.

In case that Fe-Ni as a ferromagnet is employed for the magnetic resistance elements $R_1$ to $R_4$ which is a major magnetic material, the magnetic resistance element having a thickness of 200 to 1000 Å is formed on a substrate surface such as a glass piece by a sputtering method, and a metal electrode for a lead wire is similarly formed, which is similar to the above-described conventional method.

In FIG. 5, a metal electrode 1 is used as an electrode for applying a bias voltage Vc, a metal electrode 2 is utilized as a ground electrode, metal electrodes 3 and 4 are employed as signal output terminals, whereby overall metal electrodes constitute a bridge circuit. A repetition period (S-N-S) of a magnetic field variation which is produced by the rotation of the magnetic drum 11 as a magnetic medium is determined as $\lambda$, and the magnetic resistance elements $R_1$ to $R_4$ of a ferromagnet are positioned with a $\frac{1}{4}$-$\lambda$ positional shift. Although FIG. 5 shows only the A-phase detecting circuit portion, there is also a B-phase detecting circuit (not shown) having the same circuit arrangement as that of this A-phase detecting circuit. This B-phase detecting circuit is positional-shifted by $\frac{3}{8}\cdot\lambda$ with respect to the A-phase detecting circuit.

The conventional magnetic sensor 12 having such an arrangement is positioned opposite to the magnetic drum 11 of the magnetic medium, as illustrated in FIG. 4, and resistance values of the magnetic resistance elements $R_1$ to $R_4$ are varied since the magnetic pole pattern S-N-S-N formed on the magnetic drum 11 alternately approaches these magnetic resistance elements $R_1$ to $R_4$ while the magnetic drum 11 is rotated, thereby changing the magnetic field.

When this resistance value change is caused by the magnetic resistance elements $R_1$ to $R_4$ of InSb, the magnetic field produced by the magnetic medium, which intersecting with the magnetic resistance elements $R_1$ to $R_4$ under application of the bias voltage Vc, is applied, and a Hall effect is produced under an in-phase relationship with this magnetic field variation, and then an internal impedance is varied. In this case, the magnetic resistance elements $R_1$ to $R_4$ are positionally shifted by $\frac{1}{4}\lambda$ with each other. It should be noted that although FIG. 5 shows only the A-phase detecting circuit portion, there is also provided the B-phase detecting circuit having the same circuit arrangement as that of the A-phase detecting circuit is positionally shifted by $\frac{3}{8}\lambda$ with respect to the A-phase detecting circuit.

When this resistance value variation is caused by the magnetic resistance elements $R_1$ to $R_4$ made of the ferromagnet of Fe-Ni, the direction of the self-exciting magnetization in the elements which is produced in the biasing current direction is inclined due to the magnetic field perpendicular to the biasing current direction by the magnetic medium, whereby the electric resistance value is varied at a two times higher period than that of this magnetic field variation.

As previously described, the magnetic resistance value variation mode of the magnetic resistance elements which are positionally shifted by $\frac{1}{4}\lambda$ is the reverse phase, whereas that of the magnetic resistance elements which are positionally shifted by $\frac{3}{8}\lambda$ is the 90-degree phase.

Thus, based on the output signals having the reverse phase with each other and derived from the metal electrodes 3 and 4 as the signal output terminals shown in FIG. 5, the magnetic field produced by the magnetic medium is detected so as to detect the amount of rotation and also the rotation direction of the magnetic medium.

As represented by a solid line of FIG. 6, the above-described magnetic resistance elements $R_1$ to $R_4$ are so constructed that a length "l" of the magnetic medium is 3 mm and a width "t" thereof is 20 $\mu$m in the direction normal to the moving direction as denoted by an arrow X.

If the magnetic resistance elements $R_1$ to $R_4$ are formed in such a manner that they are inclined in the direction perpendicular to the moving direction of the magnetic medium, like the magnetic element $R_1$ of FIG. 6, the magnetic field produced by the magnetic medium cannot be correctly detected. In case that, for instance, the magnetic pole pattern pitch P(S-N) of the magnetic medium is 80 $\mu$m, the allowable azimuth angle of the magnetic resistance elements $R_1$ to $R_4$ will be defined by the following equation, using the above-described l, t, and P.

$$\theta = \tan^{-1}\frac{1}{l}\left(\frac{3P}{8} - t\right) \qquad (1)$$

In the above equation (1), assuming that "l" is selected to be 3 mm, "t" is selected to be 20 $\mu$m and "P" is selected to be 80 $\mu$m, the allowable azimuth angle $\theta$, is equal to 0.2°. Accordingly, the magnetic resistance elements $R_1$ to $R_4$ are required to be inclined within the angle of 0.2 degrees. Since such an inclined angle requires the highly manufacturing precision of the magnetic sensor, the mass production thereof is necessarily lowered.

In this case, if the magnetic pole pattern pitch of the magnetic medium is set to be large, and also the shapes of the magnetic resistance elements $R_1$ to $R_4$ are made large, the lower manufacturing precision is allowed. However, as a compact magnetic resistance element is normally required recently, this solution can be hardly accepted.

The present invention has been made to solve the above-described conventional problems of the magnetic sensor, and therefore has an object to provide a compact magnetic sensor wherein the allowable azimuth angle of the magnetic resistance element can be readily relaxed.

SUMMARY OF THE INVENTION

To achieve the above-described object of the invention, in a magnetic sensor according to the invention wherein a first series circuit in which a plurality of magnetic resistance elements are connected in series with each other, is connected parallel to a second series circuit in which another plurality of magnetic resistance elements are connected in series with each other, a bridge circuit is formed where a predetermined junction point between said magnetic resistance elements of said first and second series circuits is used as a signal output terminal, said bridge circuit is positioned opposite to a movable magnetic medium, and an output signal is derived from said signal output terminal which corresponds to a magnetic field produced by said magnetic medium, said magnetic resistance elements are subdivided into a plurality of subdivided pieces in a longitudinal direction thereof, each of said subdivided pieces are arranged in the moving direction of said magnetic medium at a predetermined interval corresponding to a repetition period of said magnetic field, and each of said subdivided pieces is connected by a conductor having low resistivity with each other.

According to the invention, the magnetic resistance elements constituting each arm of the bridge circuit are subdivided into a plurality of subdivided pieces in the longitudinal direction, the respective subdivided pieces are arranged at a given repetition period, e.g., $\lambda$ in the moving direction of the magnetic medium with respect to the repetition period $\lambda$ of the magnetic field produced by the magnetic medium, and each of these subdivided pieces is connected with each other by the conductor having the low resistivity.

As a result, the magnetic resistance variation mode of a plurality of subdivided pieces constituting each arm of the bridge circuit is in phase with each other, so that from the signal output, the output signals which are emphasized with each other and correspond to the magnetic field produced by the magnetic medium, are derived.

Since each of the magnetic resistance elements is subdivided to be shortened, as compared with the conventional resistance elements, the allowable azimuth angle is relaxed. However, because the detector outputs from the respective subdivided pieces are in phase and thereby emphasized with each other, the output signals are not lowered.

BRIEF DESCRIPTION OF THE DRAWINGS

The invention will be more readily understood on reading the following description with reference to the accompanying drawings, in which.

DETAILED DESCRIPTION OF THE PREFERRED EMBODIMENTS

Figure 1:
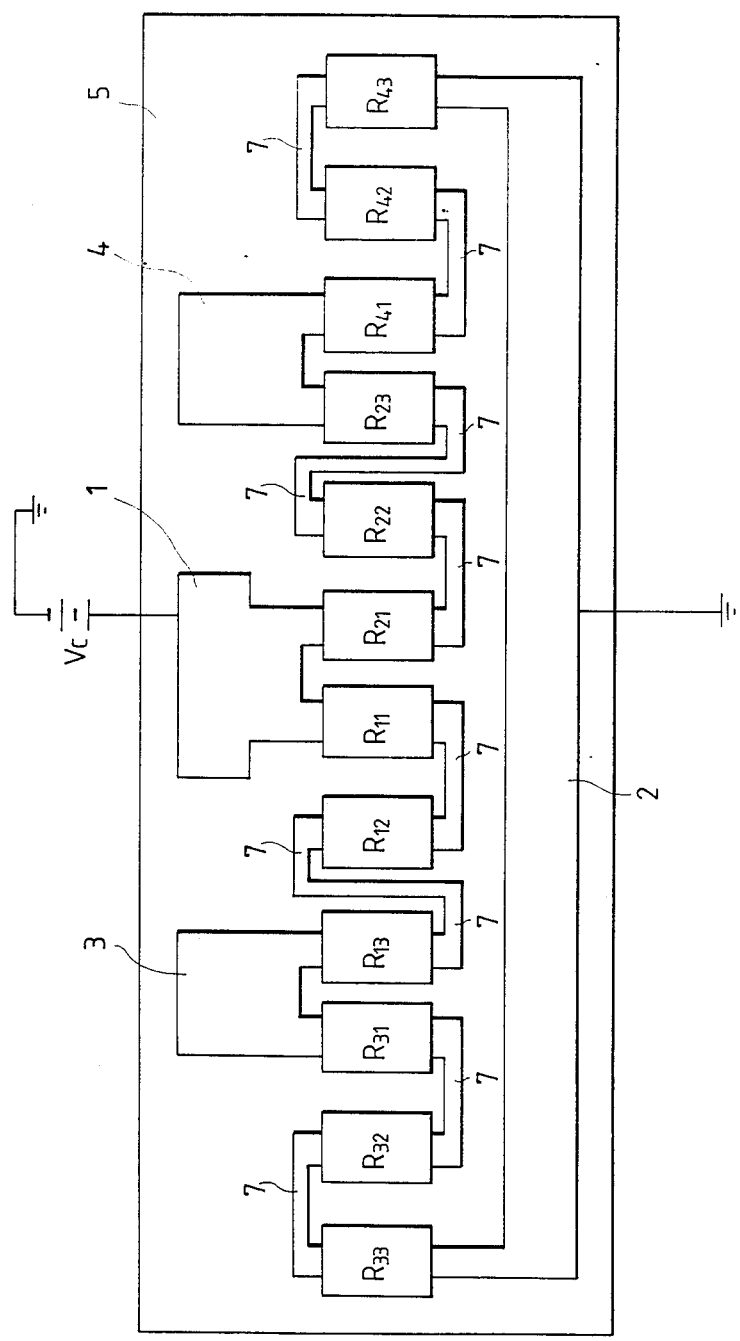
FIG. 1 is a plan view of a major portion of the magnetic sensor according to a preferred embodiment of the invention.
Figure 2:
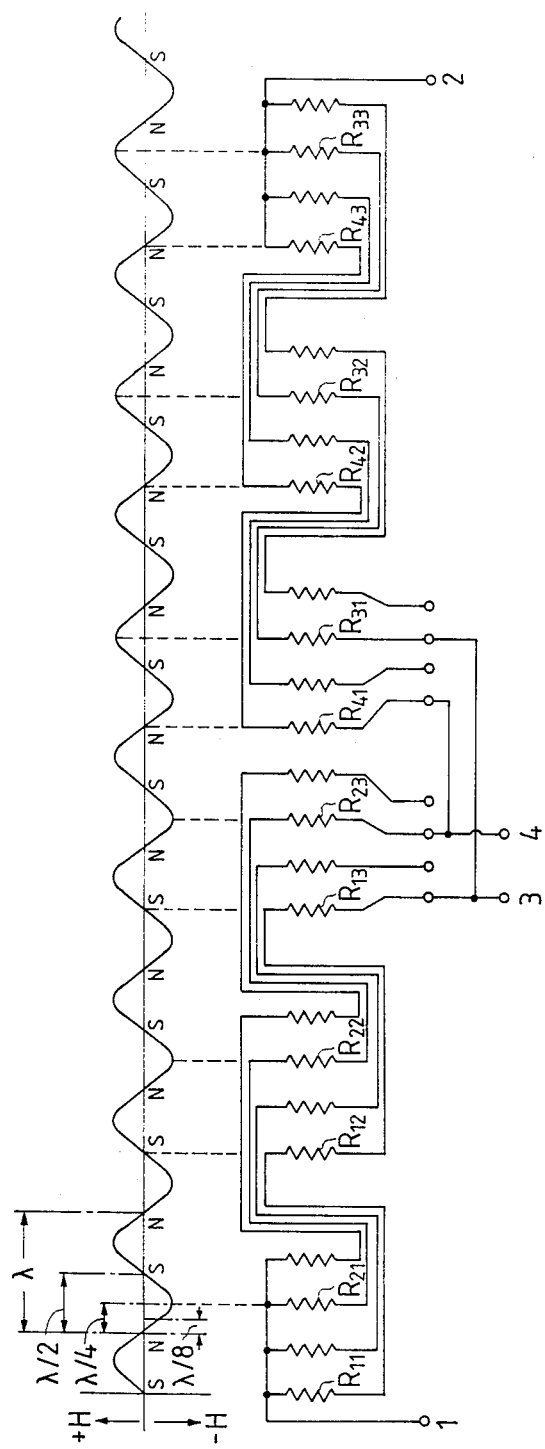
FIG. 2 is an illustration for representing an arrangement condition of the magnetic pole pattern pitchs and magnetic resistance elements according to another preferred embodiment of the invention.
Figure 3:
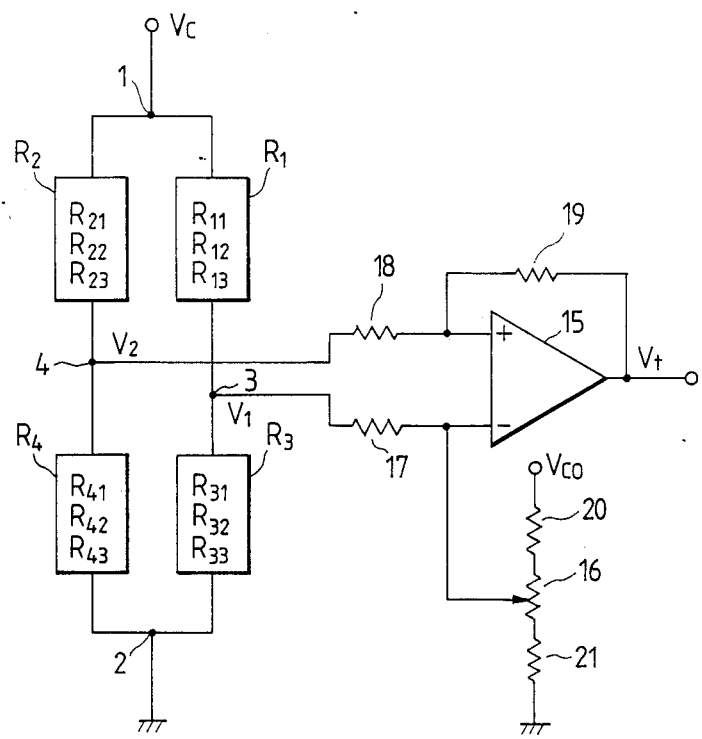
FIG. 3 is a circuit diagram of the detector circuit according to the preferred embodiment of the invention.

Referring now to FIGS. 1 to 3, one preferred embodiment of the present invention will be described in detail.

FIG. 1 is a plan view of a magnetic sensor according to one preferred embodiment of the invention. FIG. 2 illustrates an arrangement of a magnetic pole pattern pitch and magnetic resistance elements according to a further preferred embodiment of the invention. FIG. 3 is a circuit diagram of a detecting circuit according to the preferred embodiment. It should be noted that the same reference numerals employed in FIGS. 1 to 3 denote the same or similar circuit elements shown in FIGS. 4 to 6.

Figure 5:
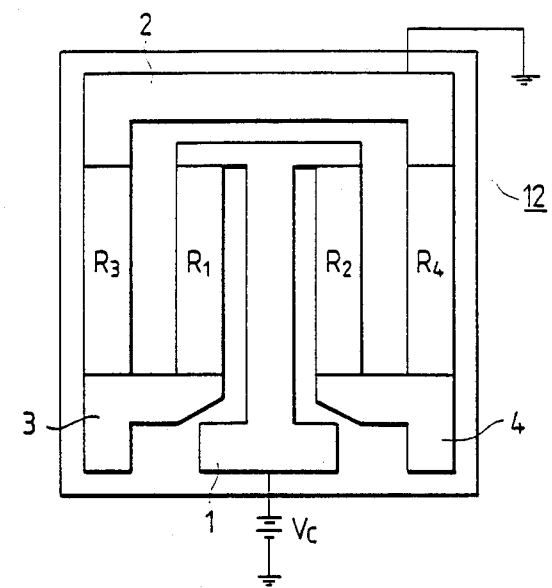
FIG. 5 is a plan view of the major portion of the conventional magnetic sensor.

As illustrated in FIG. 1, according to the preferred embodiment of the invention, with respect to the conventional magnetic sensor 12 explained by employing FIG. 5, a magnetic resistance element $R_1$ made of, for instance, a ferromagnetic material is subdivided into three subdivided pieces $R_{11}$, $R_{12}$ and $R_{13}$. These subdivided pieces are positioned on a substrate 5 in such a manner that they are positionally shifted by "$\lambda$" in the moving direction of the magnetic medium denoted by an arrow X shown in FIG. 6 and "$\lambda$" is the repetition period of the magnetic field produced by the magnetic medium.

Similarly, the magnetic resistance element $R_2$ is subdivided into three subdivided pieces $R_{21}$, $R_{22}$ and $R_{23}$, and the magnetic resistance element $R_3$ is subdivided into three subdivided pieces $R_{31}$, $R_{32}$ and $R_{33}$, and also the magnetic resistance element $R_4$ is subdivided into three subdivided pieces $R_{41}$, $R_{42}$, and $R_{43}$. These subdivided pieces $R_{21}$ to $R_{43}$ are similarly positioned on the substrate 5 with the $\lambda$-positional shift with each other in the moving direction of the magnetic medium. That is to say, each of pairs of the subdivided pieces ($R_{11}$, $R_{12}$, $R_{13}$),($R_{21}$, $R_{22}$, $R_{23}$), ($R_{31}$, $R_{32}$, $R_{33}$) and ($R_{46}$) $R_{42}$, $R_{43}$) as the magnetic resistance elements which each has no biasing magnetic field for deflecting the center detecting level, and is made of a ferromagnetic material, is so arranged that the respective subdivided pieces, for example, $R_{11}$, $R_{12}$ and $R_{13}$ are influenced under the in-phase condition by the magnetic field variation from the magnetic medium, and the respective subdivided pieces are connected with each other by conducters having low resistivity.

In FIG. 2, there is shown an arrangement condition of the A-phase and B-phase detecting circuits on the same substrate. For the sake of simplicity, only the A-phase detecting circuit to which the symbols have been added will be explained hereinafter. It should be noted that these subdivided pieces ($R_{11}$, $R_{12}$, $R_{13}$), ($R_{21}$, $R_{22}$, $R_{23}$), ($R_{31}$, $R_{32}$, $R_{33}$) and ($R_{41}$, $R_{42}$, $R_{43}$) are such magnetic resistance elements having no biasing magnetic field for deflecting the central detecting level and made of the ferromagnetic material, and each of pairs of these resistance elements is subdivided into three subdivisions, the arrangements of which are as follows. That is, the subdivided pieces $R_{11}$, $R_{12}$ and $R_{13}$ are positionally shifted by $2\lambda$ under the condition that the electric resistance is varied with the in-phase manner in accordance with the movement of the magnetic medium, and these subdivided pieces are series-connected with each other by the conductors having low resistivety. This positional relationship is the same as other subdivided pieces ($R_{21}$, $R_{22}$, $R_{23}$), ($R_{31}$, $R_{32}$, $R_{33}$) and ($R_{41}$, $R_{42}$, $R_{43}$). The interval between the subdivided pieces, e.g., $R_{11}$ and $R_{31}$ of the series-connected pairs is selected to be $6 \cdot \frac{1}{4}\lambda$ positional shift, and these pieces are arranged so that the electrical resistance is changed with the reverse phase in accordance with the movement of the magnetic medium. Also this positional relationship is applied to that of other pairs of subdivided pieces $R_{21}$ and $R_{41}$. In order that the electric resistance is varied with the reverse phase in accordance with the movement of the magnetic medium, the subdivided pieces of the series connected pair ($R_{11}$, $R_{12}$, $R_{13}$), ($R_{31}$, $R_{32}$, $R_{33}$) and the subdivided pieces of the series connected pair ($R_{21}$, $R_{22}$, $R_{23}$), ($R_{41}$, $R_{42}$, $R_{43}$), for instance, the subdivided pieces $R_{11}$ and $R_{21}$ are positionally shifted by $\frac{3}{4}\lambda$.

As illustrated in FIG. 1, a metal electrode 1 is connected to the subdivided pieces $R_{11}$, $R_{21}$ to which the biasing voltage Vc is applied, whereas another metal electrode 2 is connected to the subdivided pieces $R_{33}$ and $R_{43}$, which is grounded. A metal electrode 3 is connected to the subdivided pieces $R_{13}$ and $R_{31}$, a metal electrode 4 is connected to the subdivided pieces $R_{23}$ and $R_{41}$, and these metal electrodes 3 and 4 function as a signal output terminal of the bridge circuit. Between the respective subdivided pieces of the above-described each pair, a conductor 7 having low resistivity is connected.

As shown in FIG. 3, the metal electrodes 3 and 4 functioning as the signal output terminals of the bridge circuit which has been so arranged are connected via resistors 17 and 18 to an inverting input terminal and a non-inverting input terminal of a differential amplifier (may be constructed by a comparator circuit) 15. A resistor 19 is connected between the non-inverting input terminal of this differential amplifier 15 and an output terminal thereof. A slider terminal of a variable resistor 16 is connected to the inverting input terminal of the differential amplifier 15. A biasing voltage Vco is applied via a resistor 20 to one end of this variable resistor 16, whereas the other end of this variable resistor 16 is grounded via a resistor 21. It should be noted that although only the detecting circuit for detecting the A-phase is illustrated in FIG. 3, similarly another detecting circuit for detecting the B-phase is constructed.

Referring now to FIG. 2, an operation of the magnetic sensor according to the preferred embodiment of the invention will be described.

Figure 4:
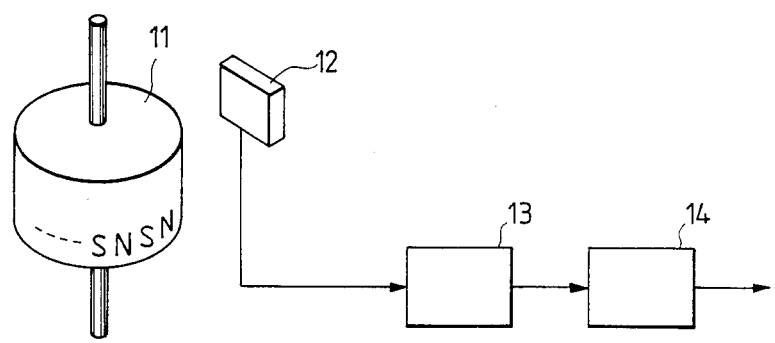
FIG. 4 represents an arrangement condition of the magnetic medium and magnetic sensor.

As previously described with reference to FIG. 4, the magnetic pattern S-N-S-N formed on the magnetic medium alternately approaches the subdivided pieces $R_{11}$, $R_{12}$,—$R_{42}$ and $R_{43}$ in accordance with the movement of the magnetic medium such as the rotation of the magnetic drum and this the magnetic field is changed. As a consequence, the resistance values of the subdivided pieces $R_{11}$, $R_{12}$,—, $R_{42}$ and $R_{43}$ are varied in response to the variation of this magnetic field.

Since, as previously explained, the subdivided pieces, for instance, $R_{11}$, $R_{12}$ and $R_{13}$ of the respective magnetic element pairs are positionally shifted by $2\lambda$ along the moving direction of the magnetic medium, the detector signals obtained from the respective subdivided pieces are superimposed with each other under the in-phase condition and output accordingly. The detector signals from each of the subdivided pieces of each pair are output under the reverse phase due to the phase difference of $n \cdot \frac{1}{2}\lambda \pm \frac{1}{4}\lambda$ (note: n=0, 1, 2,—). Then, the A-phase detector signal and B phase detector signal are output at a 90-degree phase due to the phase difference of $n \cdot \frac{1}{2}\lambda \pm \frac{1}{4}\lambda$ (where n=0, 1, 2,—).

As a result, first and second output signals $V_1$ and $V_2$ having different phases are obtained from the metal electrodes 3 and 4 shown in FIG. 3, and an output signal Vt having, for instance, a duty ratio of 50% is obtained from the output terminal of the differential amplifier 15 by adjusting the resistance value of the variable resistor 16.

Figure 6:
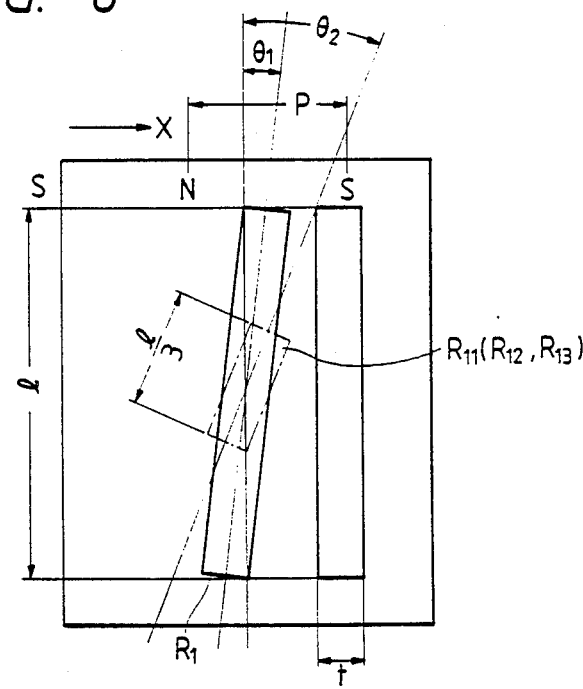
FIG. 6 is an illustration for representing the allowable azimuth angle of the magnetic sensor; and, FIG. 7 represents a positional relationship between the magnetic medium and magnetic sensor.

In accordance with the preferred embodiment of the invention, since each of the magnetic resistance elements is divided into three sub-divided pieces along its longitudinal direction, as illustrated by $R_{11}$ in comparison with $R_1$ by a dot and dash line of FIG. 6, as compared with the conventional magnetic resistance elements, the allowable azimuth angle $\theta_2$ is considerably relaxed. That is, in comparison with the conventional magnetic sensor (l=3 mm), for instance, when the allowable azimuth angle $\theta_2$ is calculated by the above equation (1) wherein l=1 mm or more, this angle $\theta_2$ is equal to 0.6°.

As a result, the manufacturing precision of the magnetic sensor according to the invention is greatly relaxed so that the mass-production of the magnetic sensor can be improved.

Also, the shape of the substrate portion 5 is shortened along the longitudinal direction of the respective subdivided pieces, as compared with the conventional substrate portion by about $\frac{1}{3}$. Although the number of the subdivided pieces arranged along the longitudinal direction of the substrate 5 is increased, the length thereof is 1 mm and the width thereof is only 20 μm, so that the length of the substrate 5 is not essentially changed in the longitudinal direction due to an increase of the number of the subdivided pieces.

As described above, the substrate portion 5 becomes small as compared with the conventional substrate portion, and the entire size of the magnetic sensor according to the invention is considerably reduced as compared with the conventional size.

Figure 7:
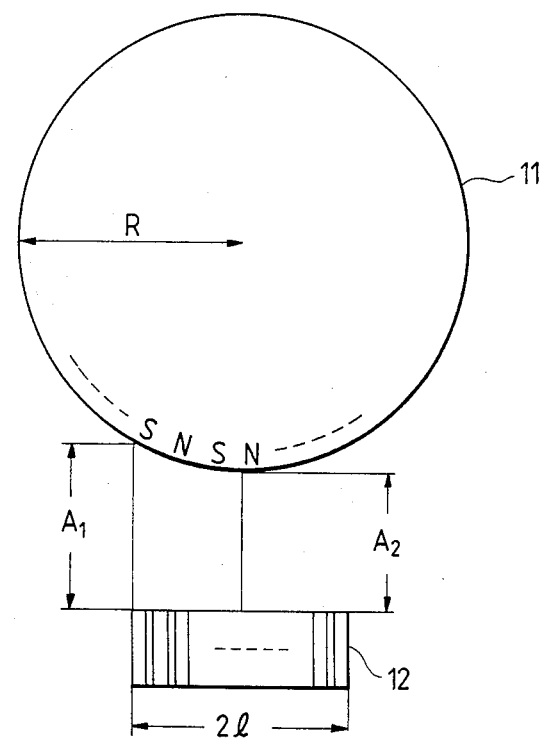

FIG. 7 illustrates a positional relationship between the magnetic drum 11 as the magnetic medium of this kind of the magnetic sensor and the magnetic sensor 12. A difference between $A_2$ and $A_1$ will be calculated under the following conditions. That is, the overall length of the magnetic resistance elements in the direction arranged on the magnetic sensor 12 is selected to be 2l; a distance between the magnetic sensor 12 and magnetic drum 11 at a center position is $A_2$, and another distance therebetween at an end position is $A_1$; the magnetic drum having a diameter of 25.48 mm and a 80 μm magnetizing pitch is employed; the magnetic resistance element is subdivided into three subdivided pieces and l is 0.85 mm.

$$A_2 - A_1 \approx 12.74 - \sqrt{12.74^2 - 0.850^2} = 0.028 \text{ mm} \qquad (2)$$

Similarly, when the magnetic resistance element is divided into two subdivided pieces, a difference between $A_2$ and $A_1$ will be obtained from equation (3):

$$A_2 - A_1 \approx 12.74 - \sqrt{12.74^2 - 0.53^2} = 0.011 \text{ mm} \quad (3)$$

According to the actual measurement results made by the inventors of the present invention, when the magnetic drum having a 80 $\lambda$m magnetization pitch was employed, it is confirmed that the allowable difference between $A_2$ and $A_1$ was approximately 45 $\mu$m in view of the variation of the output signal. As a consequence, taking account of the temperature change and also parts precision, it may be understood that three subdivision shown in equation (2) is a limited value.

As has been described above, the magnetic resistance elements according to one preferred embodiment are subdivided to form a plurality of subdivided pieces $R_{11}$ to $R_{43}$, these subdivided pieces are arranged at a predetermined interval along the moving direction of the magnetic medium, and a simple sensor construction is formed where these subdivided pieces are connected with each other by employing the conductors having the low resistivity. As a result, the allowable azimuth angle can be considerably relaxed and the mass production capability is improved and the compact sensor can be manufactured.

It should be noted that although the magnetic resistance elements were divided into three subdivided pieces along the longitudinal direction in the above-described preferred embodiment, the present invention is not limited thereto. The magnetic resistance elements may be divided into two subdivided pieces, for instance, so as to form the subdivided pieces. However, if the number of the subdivision is selected to be so large, the difference in the distance between the magnetic medium and the subdivided piece becomes great at the position of the subdivided piece, which is not preferable.

While the present invention has been described above, according to the invention, the compact and simple magnetic sensor can be provided, and the allowable azimuth angle can be greatly relaxed and the mass-production can be also considerably improved.

What is claimed is:

1. A magnetic sensor wherein a first series circuit in which a plurality of magnetic resistance elements are connected in series with each other, is connected parallel to a second series circuit in which another plurality of magnetic resistance elements are connected in series with each other, a bridge circuit is formed where a predetermined junction point between said magnetic resistance elements of said first and second series circuits is used as a signal output terminal, said bridge circuit is positioned opposite to a movable magnetic medium, and an output signal is derived from said signal output terminal which corresponds to a magnetic field produced by said magnetic medium, characterized in that:

said magnetic resistance elements are subdivided into a plurality of subdivided pieces in a longitudinal direction thereof, each of said subdivided pieces are arranged in the moving direction of said magnetic medium at a predetermined interval corresponding to a repetition period of said magnetic field, and each of said subdivided pieces is connected by a conductor having low resistivity with each other.

* * * * *